(12) United States Patent
Osada et al.

(10) Patent No.: US 9,520,273 B2
(45) Date of Patent: Dec. 13, 2016

(54) TUNER, MICROWAVE PLASMA SOURCE AND IMPEDANCE MATCHING METHOD

(71) Applicant: Tokyo Electron Limited, Tokyo (JP)

(72) Inventors: Yuki Osada, Nirasaki (JP); Hiroyuki Miyashita, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 15/073,762

(22) Filed: Mar. 18, 2016

(65) Prior Publication Data

US 2016/0276139 A1    Sep. 22, 2016

(30) Foreign Application Priority Data

Mar. 20, 2015  (JP) .................................. 2015-057528

(51) Int. Cl.
*C23F 1/00* (2006.01)
*H01J 37/32* (2006.01)

(52) U.S. Cl.
CPC ...... *H01J 37/32311* (2013.01); *H01J 37/3222* (2013.01); *H01J 37/32917* (2013.01); *H01J 2237/334* (2013.01)

(58) Field of Classification Search
CPC .............. H01J 37/32201; H01J 37/3222; H01J 37/32183
USPC ............... 156/345.41; 118/723 MW, 723 AN
See application file for complete search history.

(56) References Cited

U.S. PATENT DOCUMENTS

| 7,430,985 | B2 * | 10/2008 | Kasai | H01J 37/32192 118/723 MA |
| 8,308,898 | B2 * | 11/2012 | Kasai | H01J 37/32192 118/723 MW |
| 9,072,158 | B2 * | 6/2015 | Ikeda | H01J 37/32192 |
| 9,281,154 | B2 * | 3/2016 | Ikeda | C23C 16/45565 |
| 2009/0159214 | A1 * | 6/2009 | Kasai | H01J 37/32192 156/345.41 |
| 2011/0061814 | A1 * | 3/2011 | Ikeda | H01J 37/32192 156/345.41 |
| 2013/0180661 | A1 * | 7/2013 | Ikeda | C23C 16/45565 156/345.41 |

FOREIGN PATENT DOCUMENTS

| JP | 2000-294550 A | 10/2000 |
| JP | 2007-109457 A | 4/2007 |
| WO | 2008/013112 A1 | 1/2008 |

* cited by examiner

*Primary Examiner* — Thuy Vinh Tran
(74) *Attorney, Agent, or Firm* — Pearne & Gordon LLP (57) ABSTRACT

A tuner (43) includes a microwave transmission path (51), having a coaxial structure, configured to transmit a supplied microwave to a planar slot antenna (101); slugs (61*a*) and (61*b* made of a dielectric material and configured to be moved along the microwave transmission path (51); a slug driving unit (70) configured to move the slugs (61*a*) and (61*b*) along the microwave transmission path (51); and a control unit (80) configured to perform impedance matching by controlling positions of the slugs such that they are located at a matching position where a reflection coefficient is small, and configured to control, based on a state of the plasma, a matching track through which the slugs (61*a*) and (61*b*) reach the matching position.

10 Claims, 9 Drawing Sheets

TUNER, MICROWAVE PLASMA SOURCE AND IMPEDANCE MATCHING METHOD

CROSS-REFERENCE TO RELATED APPLICATION

This application claims the benefit of Japanese Patent Application No. 2015-057528 filed on Mar. 20, 2015, the entire disclosures of which are incorporated herein by reference.

TECHNICAL FIELD

The embodiments described herein pertain generally to a tuner configured to perform automatic impedance matching in a microwave plasma processing apparatus, a microwave plasma source and an impedance matching method.

BACKGROUND

In a manufacturing process of a semiconductor device or a liquid crystal display, a plasma processing apparatus such as a plasma etching apparatus or a plasma CVD film forming apparatus is used to perform a plasma process such as an etching process or a film forming process on a processing target substrate such as a semiconductor wafer or a glass substrate.

Recently, as such a plasma processing apparatus, a radial line slot antenna (RLSA) (registered trademark) microwave plasma processing apparatus of generating high-density plasma having a low electron temperature is attracting attention (see, for example, Patent Document 1).

In the RLSA microwave plasma processing apparatus, a planar antenna provided with a multiple number of slots formed in a preset pattern is provided at an upper portion of a chamber. In this apparatus, a microwave generated from a microwave generator is radiated from the slots of the planar antenna into the chamber, which is maintained in a vacuum, through a microwave transmission plate which is provided under the planar antenna and is made of a dielectric material. A gas introduced into the chamber is excited into plasma by this microwave electric field, and the processing target substrate such as the semiconductor wafer is processed by the plasma generated as described above Further, there is also proposed a microwave plasma processing apparatus having a microwave plasma source configured to split a microwave into plural microwaves, introduce the microwaves into a chamber via a multiple number of antenna modules having the planar antenna and combine the microwaves in a space within the chamber (Patent Document 2).

In this kind of microwave plasma processing apparatus, a tuner for automatically matching an impedance of a plasma load with a characteristic impedance of a microwave power source is required. As such a tuner, there is known a slug tuner which includes a pair of slugs movably provided within a coaxial transmission path and is configured to match the impedances by moving the slugs. A technique of automatically performing the impedance matching in this slug tuner is described in Patent Document 3.

In the technique described in Patent Document 3, a reflection coefficient of a plasma load is calculated, and the impedance matching is performed through an algorithm by which the positions of the slugs are controlled to reduce the reflection coefficient.

Patent Document 1: Japanese Patent Laid-open Publication No. 2000-294550

Patent Document 2: International Publication No. 2008/013112 Pamphlet

Patent Document 3: Japanese Patent Laid-open Publication No. 2007-109457

In this plasma processing apparatus, after plasma is ignited by locating the slugs of the tuner at an ignition position where the plasma ignition easily occurs, the slugs are moved to a matching position where the impedance is matched. Further, if a plasma condition such as a pressure, a power, a gas type or the like is changed in the state that the impedance is matched, the slugs are moved to a re-matching position where the impedance is matched under the new condition. At this time, conventionally, the slugs are moved through a matching track in which the moving distance of the slugs is shortest, only based on the reflection coefficient regardless of the plasma state. Thus, the matching track of the slugs may include an area where plasma emission intensity is low, and, in such a case, plasma may be extinguished or an operation may become unstable.

SUMMARY

In view of the foregoing, exemplary embodiments provide a tuner capable of suppressing unstable operation or extinguishment of plasma when performing impedance matching in a plasma processing apparatus that performs a plasma process by generating the plasma within a chamber with a microwave, and also provide a microwave plasma source having the tuner and an impedance matching method using the tuner.

In one exemplary embodiment, a tuner, to which a microwave is supplied from a microwave power source, is configured to transmit the microwave to a planar antenna which radiates the microwave and match an impedance of a plasma load with a characteristic impedance of the microwave power source in a plasma processing apparatus in which a plasma process is performed by generating plasma within a chamber with the microwave. Here, the tuner includes a microwave transmission path, having a coaxial structure, configured to transmit the supplied microwave to the planar antenna; at least two slugs made of a dielectric material and configured to be moved along the microwave transmission path; a driving unit configured to move the at least two slugs along the microwave transmission path; and a control unit configured to perform impedance matching by controlling positions of the at least two slugs such that the at least two slugs are located at a matching position where a reflection coefficient is small, and configured to control, based on a state of the plasma, a matching track through which the at least two slugs reach the matching position.

In the tuner of the exemplary embodiment, the control unit may be further configured to control the matching track of the at least two slugs such that a plasma state, where the plasma is extinguished or an operation becomes unstable, is not generated in the matching track.

The control unit may include a storage unit having stored therein a relationship between the positions of the at least two slugs and plasma emission intensity under each of various plasma conditions, and the control unit may be further configured to control the matching track of the at least two slugs based on the relationship stored in the storage unit.

The control unit may be further configured to control the matching track of the at least two slugs based on a detection value of a plasma emission sensor configured to detect plasma emission intensity within the chamber.

In another exemplary embodiment, a microwave plasma source in a plasma processing apparatus in which a plasma process is performed by generating microwave plasma within a chamber includes a microwave output unit, having a microwave power source, configured to output a microwave; and a microwave supply unit configured to transmit the microwave outputted from the microwave output unit and radiate the microwave into the chamber. The microwave supply unit includes a tuner as described in the exemplary embodiment; and an antenna unit having a planar antenna configured to radiate the microwave transmitted from the tuner toward the chamber.

In the microwave plasma source of the another exemplary embodiment, the microwave output unit may further include a splitter configured to split the microwave into multiple microwaves, the microwave supply unit may further include a plurality of antenna modules configured to guide the multiple microwaves into the chamber, and each antenna module may include the tuner and the antenna unit.

In still another exemplary embodiment, an impedance matching method is performed in a tuner, to which a microwave is supplied from a microwave power source, of transmitting the microwave to a planar antenna which radiates the microwave and matching an impedance of a plasma load with a characteristic impedance of the microwave power source in a plasma processing apparatus in which a plasma process is performed by generating plasma within a chamber with the microwave. The impedance matching method includes performing an impedance matching by controlling positions of at least two slugs made of a dielectric material and configured to be moved along a microwave transmission path having a coaxial structure, such that the at least two slugs are located at a matching position where a reflection coefficient is small; and controlling, based on a state of the plasma, a matching track as a moving path through which the at least two slugs reach the matching position.

In the impedance matching method of the still another exemplary embodiment, the matching track of the at least two slugs may be controlled such that a plasma state, where the plasma is extinguished or an operation becomes unstable, is not generated in the matching track.

A relationship between the positions of the at least two slugs and plasma emission intensity under each of various plasma conditions may be stored, and the matching track of the at least two slugs may be controlled based on the stored relationship.

The matching track of the at least two slugs may be controlled based on a detection value of a plasma emission sensor configured to detect plasma emission intensity within the chamber.

According to the exemplary embodiments, the impedance matching is performed by controlling the positions of the at least two slugs such that they are located at the matching position where the reflection coefficient is small. Further, the matching track, which is the moving path through which the at least two slugs reach the matching position, is controlled based on the state of the plasma. Accordingly, while the impedance matching is performed, the extinguishment of the plasma or the generation of the plasma state, where the operation becomes unstable, can be avoided. Therefore, the extinguishment of the plasma or the unstable operation can be suppressed.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein First Exemplary Embodiment (Plasma Processing Apparatus)

Figure 1:
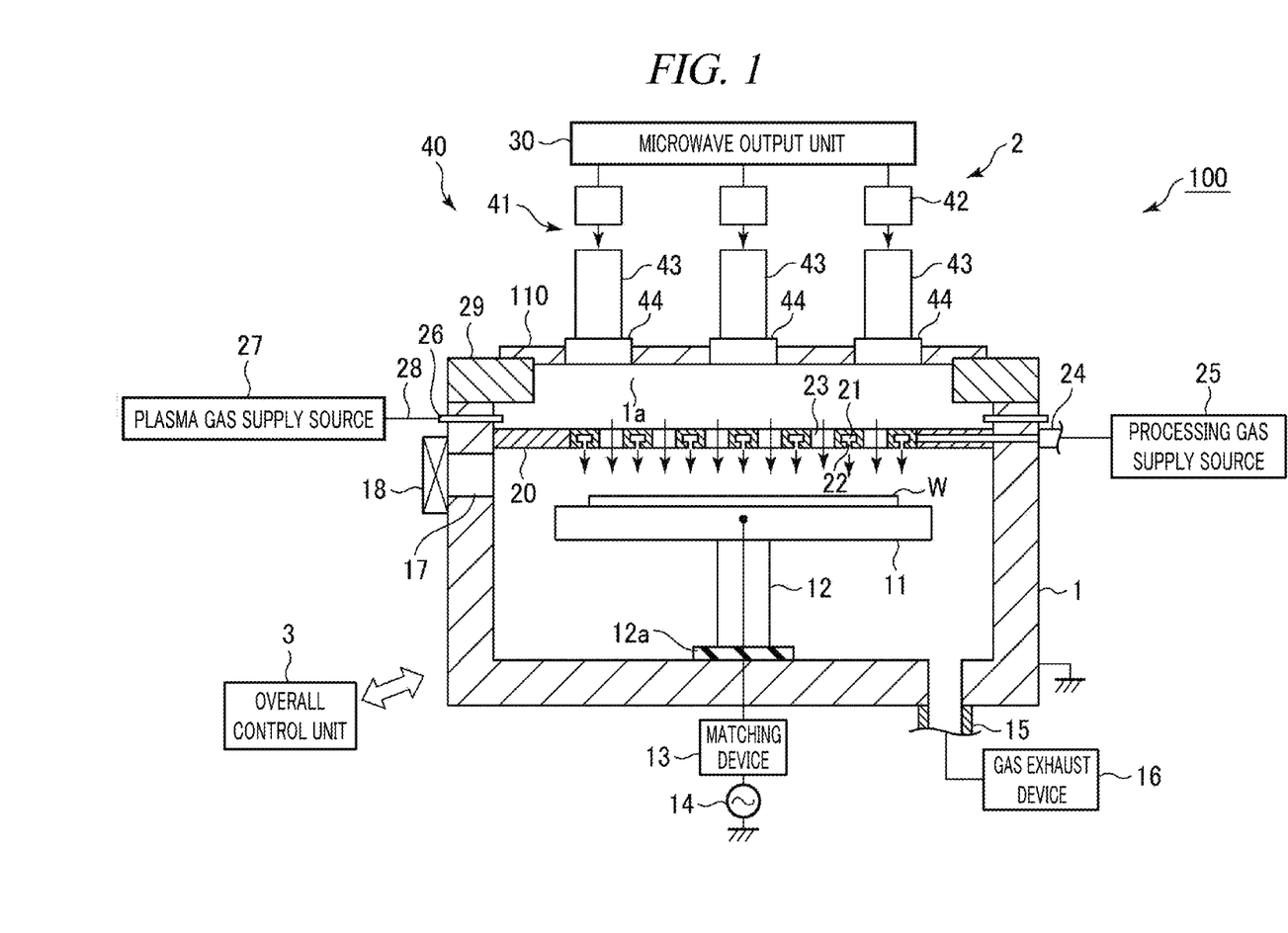
FIG. 1 is a cross sectional view illustrating a schematic configuration of a plasma processing apparatus according to a first exemplary embodiment.
Figure 2:
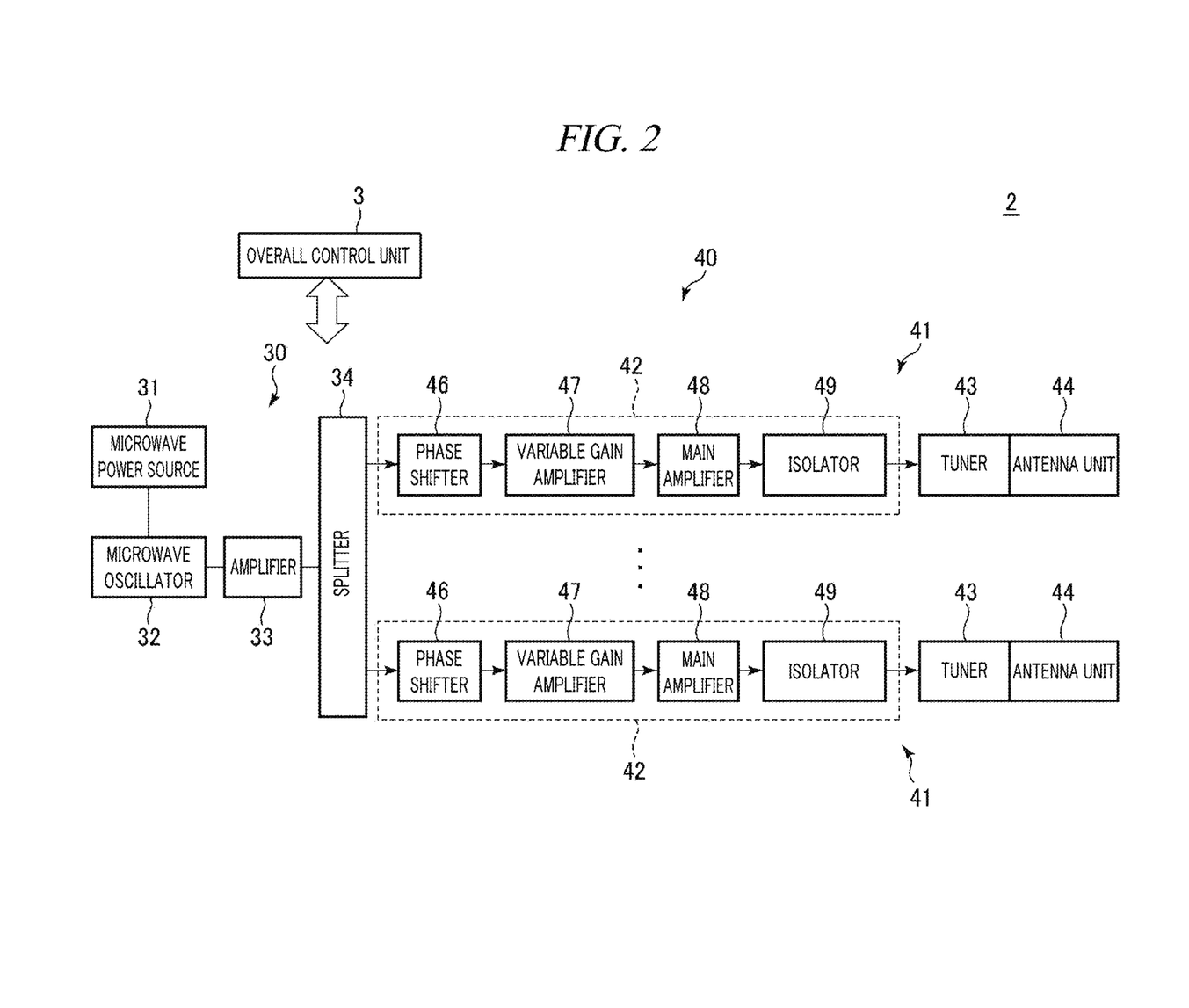
FIG. 2 is a block diagram illustrating a configuration of a microwave plasma source in the plasma processing apparatus of FIG. 1.

FIG. 1 is a cross sectional view illustrating a schematic configuration of a plasma processing apparatus in a first exemplary embodiment. FIG. 2 is a block diagram illustrating a microwave plasma source in the plasma processing apparatus of FIG. 1.

The plasma processing apparatus 100 is configured as a plasma etching apparatus configured to perform an etching process as an example of a plasma process on a wafer. The plasma processing apparatus 100 includes a substantially cylindrical chamber 1 made of a metal material such as aluminum or stainless steel; a microwave plasma source 2 configured to generate microwave plasma within the chamber 1; and an overall control unit 3. The chamber 1 is hermetically sealed and is electrically grounded. The chamber 1 has an opening 1a at an upper portion thereof, and the microwave plasma source 2 is provided to face the inside of the chamber 1 through the opening 1a.

Within the chamber 1, a susceptor 11 configured to horizontally support thereon a wafer W as a processing target substrate is held on a cylindrical supporting member 12 which stands uprightly on an insulating member 12a at the center of a bottom portion of the chamber 1. The susceptor 11 and the supporting member 12 may be made of, by way of example, but not limitation, aluminum having an alumite-treated (anodically oxidized) surface.

Further, though not shown, the susceptor 11 is provided with an electrostatic chuck configured to attract and hold the wafer W electrostatically, a temperature control mechanism, a gas flow path for supplying a heat transfer gas to a rear surface of the wafer W, an elevating pin configured to be moved up and down to transfer the wafer W, and so forth. Furthermore, the susceptor 11 is electrically connected to a high frequency bias power supply 14 via a matching device 13. By supplying a high frequency power to the susceptor 11 from the high frequency bias power supply 14, ions in plasma are attracted to the wafer W.

A gas exhaust pipe 15 is connected to a bottom portion of the chamber 1, and a gas exhaust device 16 including a vacuum pump is connected to the gas exhaust pipe 15. By operating the gas exhaust device 16, the chamber 1 is evacuated and the inside of the chamber 1 can be decompressed to a preset vacuum level at a high speed. Further, a carry-in/out opening 17 through which the wafer W is delivered and a gate valve 18 configured to open or close the carry-in/out opening 17 are provided at a sidewall of the chamber 1.

A shower plate 20 configured to discharge a processing gas for plasma etching toward the wafer W is horizontally provided above the susceptor 11 within the chamber 1. The shower plate 20 includes a gas flow path 21 formed in a lattice shape; and a multiple number of gas discharge holes 22 formed in the gas flow path 21. Spaces 23 are formed between the lattice-shaped gas flow path 21. The gas flow path 21 of the shower plate 20 is connected to a pipe 24 extended to the outside of the chamber 1, and a processing gas supply source 25 is connected to the pipe 24.

Meanwhile, above the shower plate 20 of the chamber 1, a ring-shaped plasma gas inlet member 26 is provided along a chamber wall. The plasma gas inlet member 26 is provided with a multiple number of gas discharge holes at an inner peripheral portion thereof. A plasma gas supply source 27 configured to supply a plasma gas is connected to the plasma gas inlet member 26 via a pipe 28. As the plasma gas, an Ar gas or the like may be appropriately used.

The plasma gas introduced into the chamber 1 from the plasma gas inlet member 26 is excited into plasma by a microwave introduced into the chamber 1 from the microwave plasma source 2. This Ar plasma gas excites a processing gas discharged from the gas discharge holes 22 of the shower plate 20 through the spaces 23 of the shower plate 20, so that plasma of the processing gas is generated.

Further, the plasma gas and the processing gas may be supplied by a same supply member.

A ceiling plate 110 is provided at the top portion of the chamber 1 while held on a supporting ring 29, and the microwave plasma source 2 is provided on the ceiling plate 110.

The overall control unit 3 includes a controller (computer) implemented by a microprocessor, and controls individual components (the microwave plasma source 2, the high frequency bias power supply 14, the gate valve 18, the gas supply sources 25 and 27, and so froth) in the plasma processing apparatus 100. The overall control unit 3 also includes a storage unit having stored thereon process recipes as control parameters and process sequences of the plasma processing apparatus 100, or an input device, a display, and the like. The overall control unit 3 controls a process within the plasma processing apparatus 100 based on a selected process recipe.

(Microwave Plasma Source)

Now, the microwave plasma source 2 will be elaborated. As depicted in FIG. 2, the microwave plasma source 2 includes a microwave output unit 30 configured to output a microwave by splitting the microwave into plural paths; and a microwave supply unit 40 configured to transmit and radiate the microwave outputted from the microwave output unit 30 into the chamber 1.

The microwave output unit 30 includes a microwave power source 31, a microwave oscillator 32, an amplifier 33 configured to amplify an oscillated microwave, and a splitter 34 configured to split the amplified microwave into multiple microwaves.

The microwave oscillator 32 is configured to perform, e.g., a PLL (Phase Locked Loop) oscillation, to generate a microwave of a preset frequency (e.g., about 860 MHz). The splitter 34 is configured to split the microwave amplified by the amplifier 33 while matching impedance between an input side and an output side in order to minimize a loss of the microwave. Here, the frequency of the microwave may not be limited to 860 MHz, but may be selected within the range from 700 MHz to 3 GHz.

The microwave supply unit 40 includes a multiplicity of antenna modules 41 configured to introduce the microwaves split from the splitter 34 into the chamber 1. Each antenna module 41 includes an amplifier unit 42 configured to mainly amplify the split microwave; a tuner 43 configured to perform impedance matching of the microwave amplified by the amplifier unit 42; and an antenna unit 44 having a planar slot antenna 101 provided at a tip end of the tuner 43. The tuner 43 and the antenna unit 44 are provided as a single body. In each antenna module 41, the microwave is radiated into the chamber 1 from the antenna unit 44.

The amplifier unit 42 includes a phase shifter 46, a variable gain amplifier 47, a main amplifier 48 serving as a solid state amplifier, and an isolator 49.

The phase shifter 46 is configured to change a phase of the microwave. By adjusting the phase of the microwave, a radiation characteristic of the microwave can be modulated. By way of example, by adjusting the phase of the microwave for each antenna module, directivity is adjusted, so that a plasma distribution can be varied. Furthermore, by setting each of adjacent antenna modules to have a phase delay of 90 degrees, a circularly polarized wave can be obtained. In addition, the phase shifter 46 adjusts a delay characteristic between components within the amplifier, and, thus, can spatially combine the microwaves within the tuner. However, when the modulation of the radiation characteristic of the microwave or the adjustment of the delay characteristic between the components within the amplifier are not necessary, the phase shifter 46 may be omitted.

The variable gain amplifier 47 is configured to adjust a power level of a microwave inputted to the main amplifier 48 and, also, to adjust non-uniformity between the individual antenna modules or to adjust plasma intensity. By adjusting the variable gain amplifier 47 for each antenna module, the distribution of the generated plasma may be varied.

The main amplifier 48 serving as the solid state amplifier includes, for example, an input matching circuit, a semiconductor amplifying device, an output matching circuit and a high-Q resonant circuit.

The isolator 49 is configured to separate a reflected microwave which is reflected by the antenna unit 44 toward the main amplifier 48. The isolator 49 includes a circulator and a dummy load (coaxial terminator). The circulator guides the reflected microwave from the antenna unit 44 to the dummy load, and the dummy load converts the reflected microwave, which is guided by the circulator, into heat.

The individual components of the microwave plasma source 2 are controlled by the overall control unit 3.

(Tuner)

Now, the tuner 43 will be elaborated.

Figure 3:
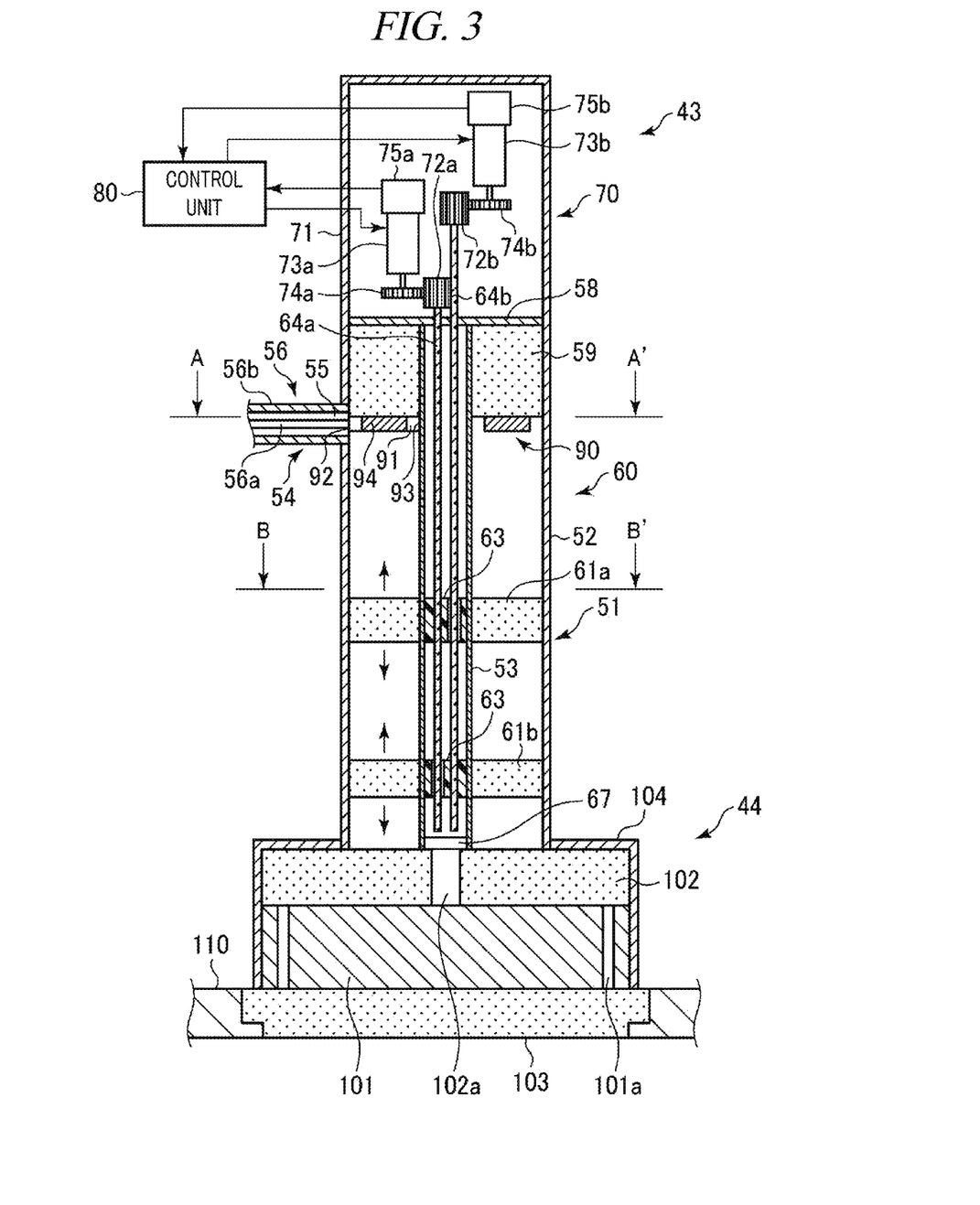
FIG. 3 is a cross sectional view illustrating a structure of a tuner and an antenna unit in the microwave plasma source of FIG. 2.

FIG. 3 is a cross sectional view illustrating the tuner 43 and the antenna unit 44.

As depicted in FIG. 3, the tuner 43 is configured to transmit a microwave supplied from the microwave power source 31 to the planar slot antenna 101 configured to radiate the microwave. Further, the tuner 43 is also configured to match a load impedance with a characteristic impedance of the microwave power source 31. The tuner 43 is configured as a slug tuner that performs the impedance matching by two slugs.

The tuner 43 includes a tuning unit 60 in which the two slugs are moved to perform the tuning; a slug driving unit 70 configured to drive the slugs; and a control unit 80 configured to control positions of the slugs. The slug driving unit 70 is provided above the tuning unit 60, and the antenna unit 44 is provided under the tuning unit 60.

The tuning unit 60 includes a microwave transmission path 51 in which a cylindrical outer conductor 52 and a cylindrical inner conductor 53 are coaxially arranged; and a first slug 61a and a second slug 61b configured to be moved up and down between the outer conductor 52 and the inner conductor 53. The first slug 61a is provided at an upper side, whereas the second slug 61b is provided at a lower side. The inner conductor 53 is configured as a power feed side, whereas the outer conductor 52 is configured as a ground side. Upper ends of the outer conductor 52 and the inner conductor 53 are formed of a reflector 58.

A power supply mechanism 54 configured to supply a microwave is provided at a base end of the microwave transmission path 51. The power supply mechanism 54 has a microwave power inlet port 55 which is provided at a side surface of the microwave transmission path 51 (outer conductor 52) to introduce a microwave power. A coaxial line 56 including an inner conductor 56a and an outer conductor 56b is connected to the microwave power inlet port 55 as a power feed line through which the microwave amplified by the amplifier unit 42 is supplied. Further, a power supply antenna 90 horizontally extended toward the inside of the outer conductor 52 is connected to a tip end of the inner conductor 56a of the coaxial line 56.

The power supply antenna 90 is fabricated by cutting a metal plate of, for example, aluminum and fitting the cut metal plate into a frame made of a dielectric member such as, for example, Teflon (registered trademark). A wavelength shortening member 59 made of a dielectric material such as Teflon (registered trademark) is provided between the reflector 58 and the power supply antenna 90 to shorten an effective wavelength of a reflected wave. If, however, a microwave having a high frequency of, e.g., 2.45 GHz is used, the wavelength shortening member 59 may not be necessary. Here, by optimizing a distance from the power supply antenna 90 to the reflector 58 and reflecting an electromagnetic wave radiated from the power supply antenna 90 by the reflector 58, a maximum amount of electromagnetic wave can be transmitted through the microwave transmission path 51 having the coaxial structure.

Figure 4:
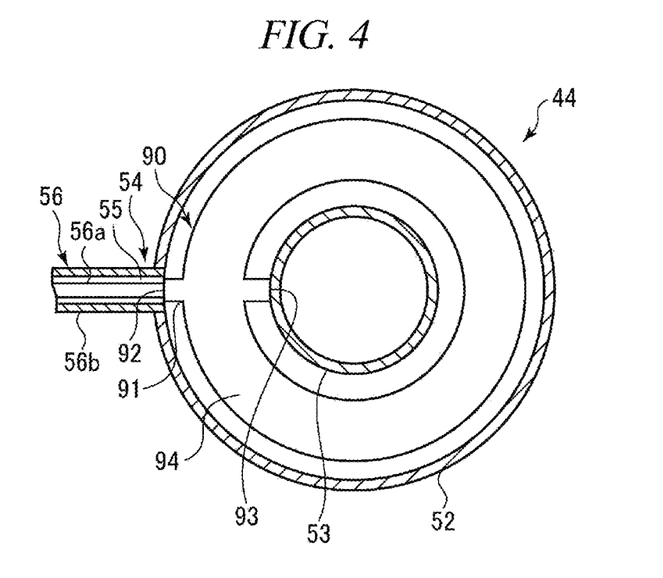
FIG. 4 is a cross sectional view taken along a line A-A' of FIG. 3.

As depicted in FIG. 4, the power supply antenna 90 includes an antenna main body 91; and a ring-shaped reflection member 94 extended along the outside of the inner conductor 53 from both sides of the antenna main body 91. The antenna main body 91 is connected to the inner conductor 56a of the coaxial line 56 at the microwave power inlet port 55, and has a first pole 92 to which the electromagnetic wave is supplied and a second pole 93 that radiates the supplied microwave. The electromagnetic wave inputted to the antenna main body 91 and the electromagnetic wave reflected by the reflection member 94 forms a standing wave. The second pole 93 of the antenna main body 91 is in contact with the inner conductor 53.

As the power supply antenna 90 radiates the microwave (electromagnetic wave), a microwave power is supplied into a space between the outer conductor 52 and the inner conductor 53. The microwave power supplied to the power supply mechanism 54 is then propagated toward the antenna unit 44.

Further, two slug moving shafts 64a and 64b, each of which is formed of a screw rod provided with a trapezoidal screw, for example, are arranged in a space within the inner conductor 53 along a lengthwise direction thereof.

Figure 5:
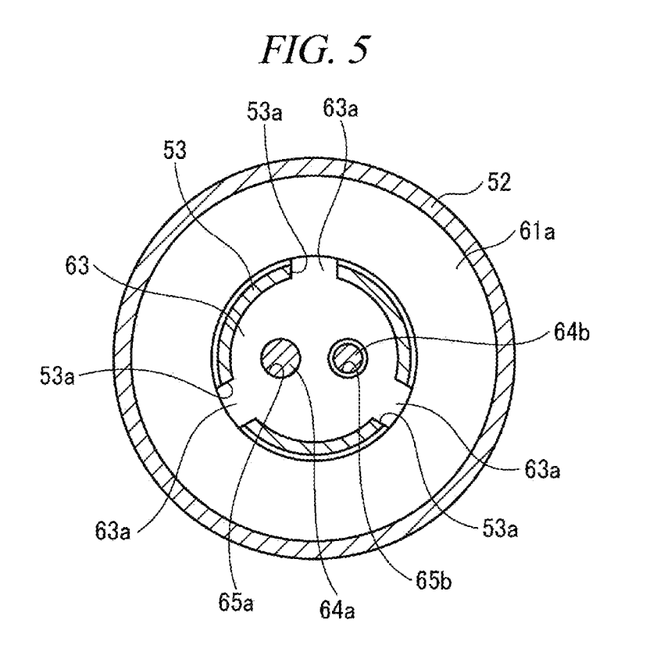
FIG. 5 is a cross sectional view taken along a line B-B' of FIG. 3.

As depicted in FIG. 5, the first slug 61a has a ring shape formed of a dielectric material such as, but not limited to, alumina, and a sliding member 63 formed of a resin having lubricant property is fitted into the first slug 61a. The sliding member 63 is provided with a screw hole 65a into which the slug moving shaft 64a is screwed; and a through hole 65b through which the slug moving shaft 64b is inserted. Likewise, the second slug 61b has a ring shape formed of a dielectric material such as, but not limited to, alumina, and has a screw hole 65a and a through hole 65b. By contrast with the first slug 61a, the slug moving shaft 64b is screwed into the screw hole 65a, and the slug moving shaft 64a is inserted through the through hole 65b. With this configuration, by rotating the slug moving shaft 64a, the first slug 61a is moved up and down, and by rotating the slug moving shaft 64b, the second slug 61b is moved up and down. That is, the first slug 61a and the second slug 61b are moved up and down by a screw mechanism composed of the slug moving shafts 64a and 64b and the sliding member 63.

The inner conductor 53 is provided with three slits 53a in the lengthwise direction thereof, and the slits 53a are arranged to be equi-spaced along the circumference of the inner conductor 53. Meanwhile, the sliding member 63 is provided with equi-spaced three protrusions 63a corresponding to the slits 53a. With the protrusions 63a in contact with inner surfaces of the first slug 61a and the second slug 61b, the sliding member 63 is fitted into the first slug 61a and the second slug 61b. An outer surface of the sliding member 63 is in frim contact with an inner surface of the inner conductor 53 without a clearance therebetween. As the slug moving shafts 64a and 64b are rotated, the sliding member 63 is slid within the inner conductor 53 to be moved up and down. That is, the inner surface of the inner conductor 53 serves as a sliding guide of the first slug 61a and the second slug 61b.

The slug moving shafts 64a and 64b are extended toward the slug driving unit 70 through the reflector 58. Bearings (not shown) are provided between the slug moving shafts 64a and 64b and the reflector 58. Further, a bottom plate 67 made of a conductor is provided at a lower end of the inner conductor 53. Lower ends of the slug moving shafts 64a and 64b are typically open ends to absorb vibration generated when they are driven. The bottom plate 67 is disposed 2 mm to 5 mm apart from the lower ends of the slug moving shafts 64a and 64b. Alternatively, the bottom plate 67 may be used as a bearing, and the lower ends of the slug moving shafts 64a and 64b may be supported on this bearing.

The slug driving unit 70 includes a housing 71. The slug moving shafts 64a and 64b are extended into the housing 71, and gears 72a and 72b are provided on upper ends of the slug moving shafts 64a and 64b, respectively. Furthermore, the slug driving unit 70 includes a motor 73a configured to rotate the slug moving shaft 64a, and a motor 73b configured to rotate the slug moving shaft 64b. A gear 74a is provided at a shaft of the motor 73a, and a gear 74b is provided at a shaft of the motor 73b. The gear 74a is engaged with the gear 72a, and the gear 74b is engaged with the gear 72b. Accordingly, the slug moving shaft 64a is rotated by the motor 73a via the gears 74a and 72a, and the slug moving shaft 64b is rotated by the motor 73b via the gears 74b and 72b. Here, the motors 73a and 73b are, for example, stepping motors.

Moreover, the slug moving shaft 64b is longer than the slug moving shaft 64a and reaches a higher position than the slug moving shaft 64a. Accordingly, the positions of the gears 72a and 72b are offset in a vertical direction, and the positions of the motors 73a and 73b are also offset in the vertical direction. Therefore, a space occupied by a power transmission mechanism such as the motors and the gears is small, and the housing 71 has the same diameter as that of the outer conductor 52.

Incremental encoders 75a and 75b configured to detect the positions of the slugs 61a and 61b are provided on the motors 73a and 73b to be directly connected to the output sides thereof, respectively.

Figure 6:
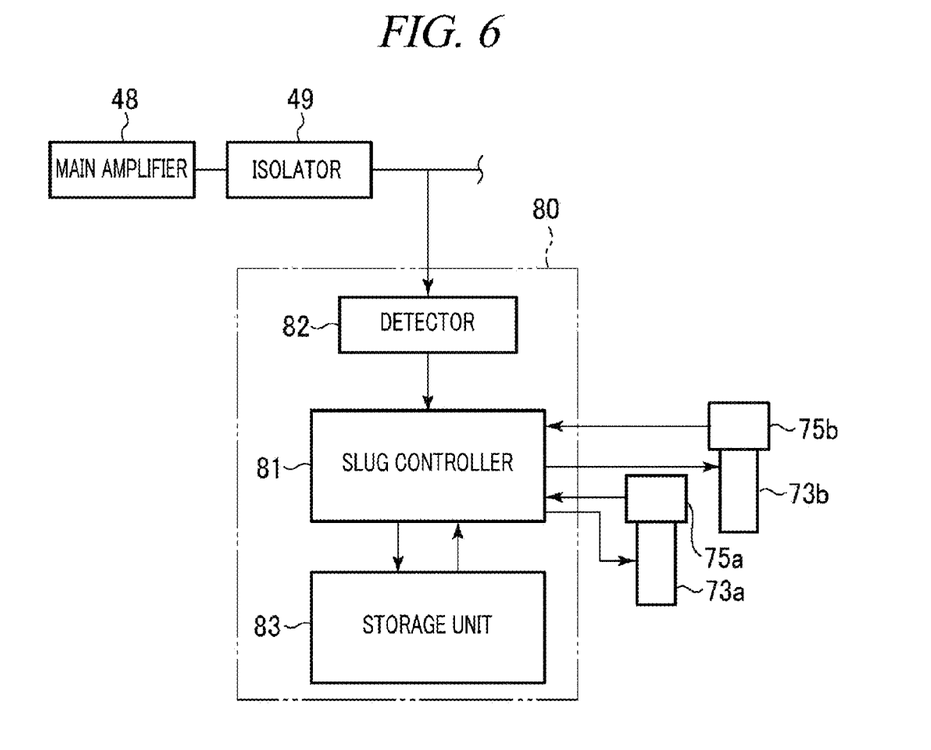
FIG. 6 is a block diagram illustrating a control unit of the tuner according to the first exemplary embodiment.

The control unit 80 includes, as illustrated in FIG. 6, a slug controller 81, a detector 82 and a storage unit 83. The detector 82 detects an impedance value at an input end, or detects a progressive wave and a reflection wave via a directional coupler. Further, the storage unit 83 stores therein tables indicating a relationship between the positions of the first and second slugs 61a and 61b and plasma emission intensity under various plasma conditions. The plasma conditions include a gas type, a gas flow rate, a pressure, a power, an antenna type, and so forth. The slug controller 81 sends control signals to the motors 73a and 73b based on the detection value of the detector 82 and the position information of the first and second slugs 61a and 61b detected by the encoders 75a and 75b. Further, the slug controller 81 performs impedance matching by controlling the positions of the first slug 61a and the second slug 61b such that the first slug 61a and the second slug 61b are located at the matching position where the reflection coefficient is small. In addition, based on a plasma state, specifically, based on the relationship between the positions of the first and second slugs 61a and 61b stored in storage unit 83 and the plasma emission intensity, the slug controller 81 controls a matching track which is a moving path through which the first slug 61a and the second slug 61b reach the matching position. The slug controller 81 performs the impedance matching such that an impedance of a terminal end becomes, for example, 50Ω. If only one of the two slugs is moved, a track passing through an origin of the Smith chart is created. If the slugs are both moved, on the other hand, only a phase is rotated.

(Antenna Unit)

The antenna unit 44 is depicted in FIG. 3 along with the tuner. The antenna unit 44 includes a planar slot antenna 101 serving as a microwave radiation antenna and having slots 101a; a wavelength shortening member 102 provided on a top surface of the planar slot antenna 101; and a microwave transmitting plate 103 provided at a tip end side of the planar slot antenna 101 and made of a dielectric material.

The shape of the slot 101a is appropriately set to allow a microwave to be efficiently radiated. A dielectric member may be inserted into the slot 101a.

A cylindrical member 102a formed of a conductor is provided to penetrate a center of the wavelength shortening member 102 while connecting the bottom plate 67 of the tuner 43 with the planar slot antenna 101. Accordingly, the inner conductor 53 of the tuber 43 is connected to the planar slot antenna 101 via the bottom plate 67 and the cylindrical member 102a.

The wavelength shortening member 102 and the microwave transmitting plate 103 are formed of a dielectric material having a permittivity higher than the vacuum permittivity, such as, but not limited to, quartz, ceramics, a fluorine-based resin such as polytetrafluoroethylene, or a polyimide-based resin. In the vacuum, the wavelength of a microwave is lengthened. In view of this, by forming the wavelength shortening member 102 and the microwave transmitting plate 103 with the dielectric material having the permittivity higher than the vacuum permittivity, the wavelength of the microwave can be shortened and the antenna can be scaled down. By adjusting the thickness of the wavelength shortening member 102, the phase of the microwave can be adjusted. The thickness of the wavelength shortening member 102 is adjusted such that the "antinode" of the standing wave occurs at a joint portion between the microwave transmitting plate 103 and the planar slot antenna 101. Accordingly, radiation energy of the planar slot antenna 101 can be maximized, while the reflection is minimized.

Furthermore, the outer conductor 52 is extended to a top surface of the wavelength shortening member 102, and outer surfaces of the wavelength shortening member 102 and the planar slot antenna 101 are covered with a coating conductor 104.

The microwave transmitting plate 103 is provided to be in contact with the planar slot antenna 101 and is fitted into the ceiling plate 110. The microwave amplified by the main amplifier 48 is supplied to the tuner 43 by the power supply mechanism 54 through the coaxial line 56 and transmitted through the microwave transmission path 51 of the tuner 43 to reach the planar slot antenna 101. Then, the microwave is radiated from the slots 101a and reaches the space within the chamber 1 through the microwave transmitting plate 103, so that the surface wave plasma is generated.

In the present exemplary embodiment, the main amplifier 48, the tuner 43 and the planar slot antenna 101 are placed adjacent to each other. Further, the tuner 43 and the planar slot antenna 101 form a lumped constant circuit presented within ½ wavelength. Further, a combined resistance of the planar slot antenna 101, the wavelength shortening member 102 and the microwave transmitting plate 103 is set to be 50Ω. Accordingly, the tuner 43 can directly tune the plasma load, so that the energy can be efficiently transferred to the plasma.

(Operation of Plasma Processing Apparatus)

Now, an operation of the plasma processing apparatus 100 having the above-described configuration will be discussed.

First, a wafer W is carried into the chamber 1 and mounted on the susceptor 11. Then, while supplying a plasma gas, e.g., an Ar gas into the chamber 1 from the plasma gas supply source 27 through the pipe 28 and the plasma gas inlet member 26, a microwave is radiated into the chamber 1 from the microwave plasma source 2, so that a surface wave plasma is generated within the chamber 1.

Then, a processing gas, e.g., an etching gas such as a $Cl_2$ gas is discharged from the processing gas supply source 25 into the chamber 1 via the pipe 24 and the shower plate 20. The discharged processing gas is excited into plasma by the plasma that has passed through the spaces 23 of the shower plate 20. By this plasma of the processing gas, a plasma process such as an etching process is performed on the wafer W.

When the surface wave plasma is generated, in the microwave plasma source 2, a microwave power oscillated by the microwave oscillator 32 of the microwave output unit 30 is amplified by the amplifier 33, and the amplified microwave power is split by the splitter 34 in plural microwave powers. Then, these microwave powers are guided to the microwave supply unit 40. In the microwave supply unit 40, for each of the microwave powers, the microwave power is amplified by the main amplifier 48, serving as a solid state amplifier, to be supplied into the tuner 43. Then, the microwave power is transmitted to the antenna unit 44 through the microwave transmission path 51. At this time, the impedance matching is automatically performed by the first slug 61a and the second slug 61b of each tuner 43. Then, without substantial power reflection, the microwave power is transmitted via the wavelength shortening member 102 of the antenna unit 44 from the tuner 43, and then, radiated from the slots 101a of the planar slot antenna 101. Then, the microwave power is transmitted through the microwave transmitting plate 103 and propagated on a surface (bottom surface) of the microwave transmitting plate 103 which is in contact with the plasma, so that the surface wave is generated. The powers of the respective antenna units 44 are combined in the space within the chamber 1, so that the surface wave plasma is generated in the space within the chamber 1 and the wafer W as a processing target object is plasma-processed.

As stated above, after the split microwaves are individually amplified by the main amplifiers 48 serving as the solid state amplifiers, the microwaves are individually introduced into the chamber 1 from the antenna units 44 to form the surface waves, and then, these are combined in the space. Thus, a large-sized isolator or combiner is not necessary. Furthermore, since the tuner 43 and the antenna unit 44 are provided as a single body, a compact apparatus can be provided. In addition, the main amplifier 48, the tuner 43 and the planar slot antenna 101 are positioned adjacent to each other, and the tuner 43 and the planar slot antenna 101 form the lumped constant circuit and serve as a resonator. Accordingly, the plasma and the like can be tuned by the tuner 43 with high accuracy at a portion where the planar slot antenna is provided, where the impedance mismatching exists, and an influence of the reflection can be securely suppressed.

In addition, since the tuner 43 and the planar slot antenna 101 are positioned adjacent to each other, form the lumped constant circuit and serve as the resonator, the impedance mismatching up to the planar slot antenna 101 can be removed with high accuracy. Further, since the impedance-mismatched portion can be substantially used as a plasma space, it is possible to perform a plasma control with high accuracy by the tuner 43.

To match the impedance of the plasma load with the characteristic impedance of the microwave power source by the tuner 43, there is used an algorithm in which a position control of the first slug 61a and the second slug 61b is performed such that the first slug 61a and the second slug 61b are located at the matching position where the reflection coefficient is small. Conventionally, however, the slugs are moved through a matching track in which the moving distance of the slugs is shortest, only based on the reflection coefficient regardless of the plasma state. Therefore, after the plasma is ignited by locating the slugs of the tuner at an ignition position where the plasma ignition easily occurs, the matching track through which the slugs are moved to the matching position where the impedance matching is performed may include an area where the plasma emission intensity is low. In such a case, the plasma may be extinguished or the operation may become unstable. Further, if a plasma condition such as a pressure, a power, a gas type or the like is changed in the state that the impedance matching is performed, a matching track through which the slugs are moved to a re-matching position where the impedance matching is performed under the new condition may also include an area where the plasma emission intensity is low, and, in such a case, the plasma may be extinguished or the operation may become unstable.

Hereinafter, further detailed description will be provided with reference to FIG. 7 and FIG. 8.

Figure 7:
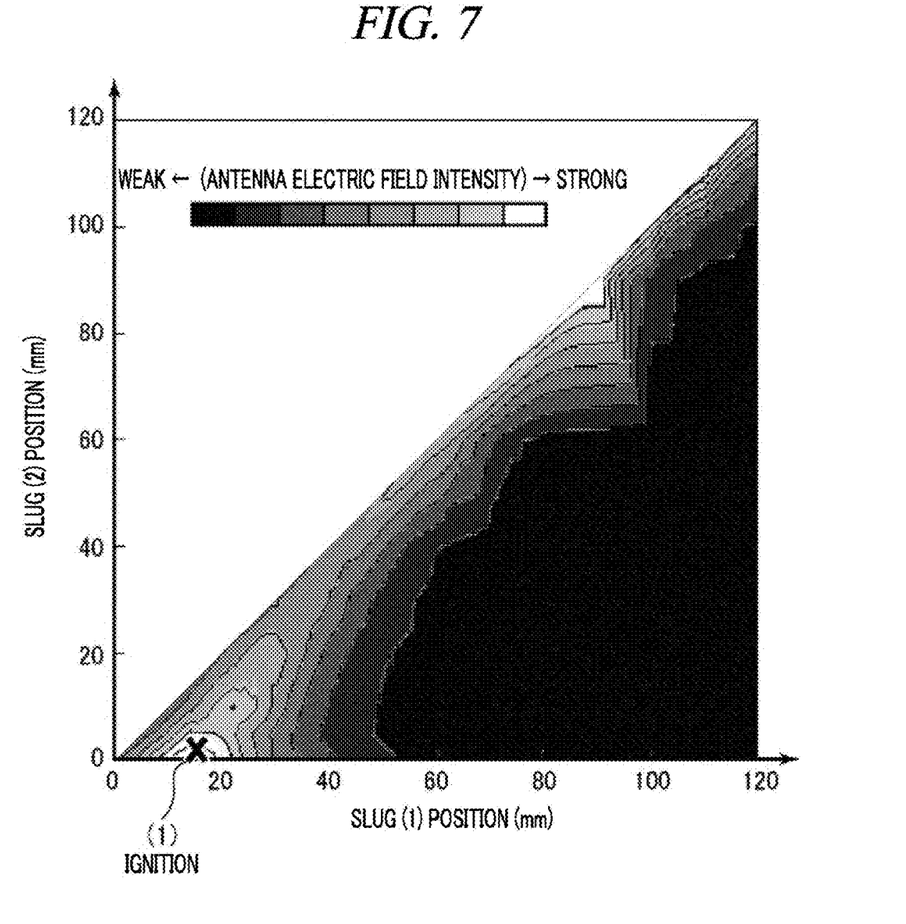
FIG. 7 is a diagram showing a map of electric field intensity of a microwave with respect to rectangular coordinates indicating positions of two slugs.
Figure 8:
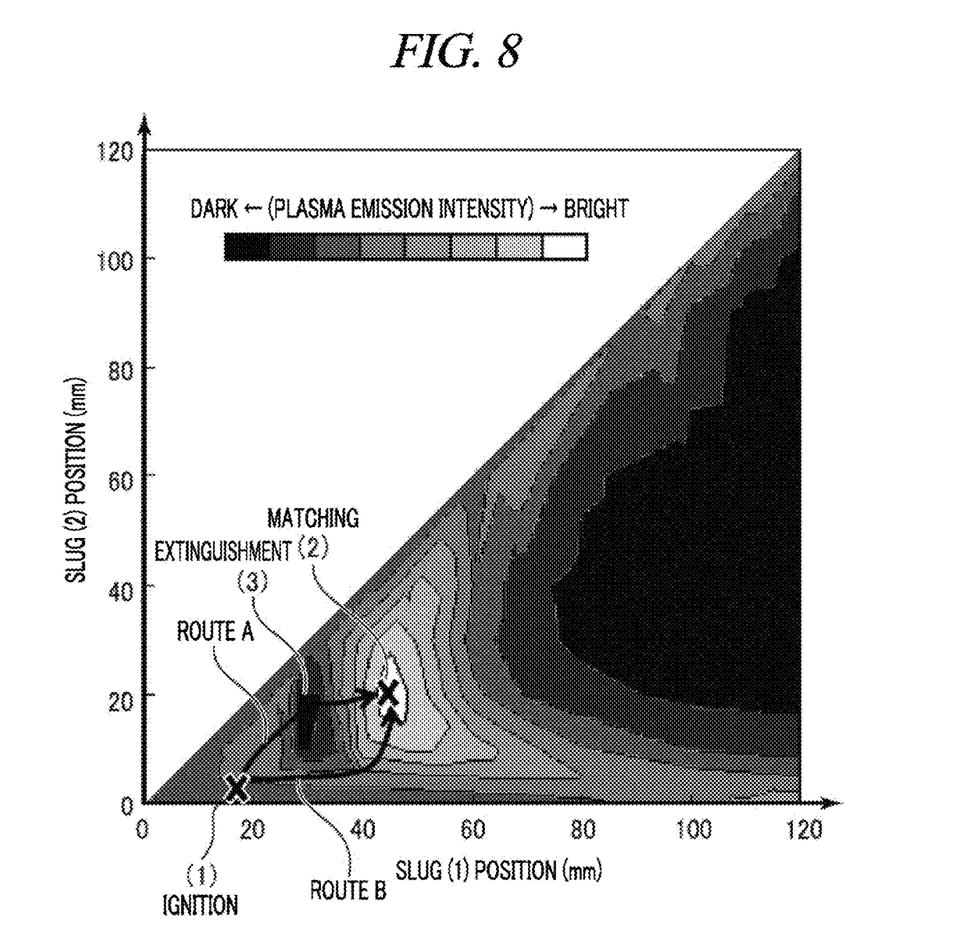
FIG. 8 is a diagram showing a map of plasma emission intensity with respect to rectangular coordinates indicating positions of two slugs.

FIG. 7 is a diagram showing a map of the electric field intensity of the microwave with respect to rectangular coordinates indicating the positions of the two slugs, and FIG. 8 is a diagram showing a map of the plasma emission intensity with respect to rectangular coordinates indicating the positions of the two slugs.

For example, at the time of plasma ignition, the plasma may be easily ignited when the electric field intensity of the microwave radiated from the planar slot antenna is high. Thus, as depicted in FIG. 7, the plasma ignition is performed after the first slug and the second slug are set to a position (1) where the electric field intensity is high. That is, the position (1) is the ignition position. However, at the position where the impedance matching is performed, the reflection coefficient is a minimum and the plasma emission intensity is high (plasma is bright), and is different from the ignition position (1). Thus, after the plasma is ignited, the first slug and the second slug are moved from the position (1) to a position (2) as the matching position where the reflection coefficient is the minimum and the plasma emission intensity is high, as depicted in FIG. 8. At this time, in the example of FIG. 8, if the matching track of the slugs is set as a shortest route A, the matching track includes an area (3) where the plasma emission intensity is low. Therefore, there is a likelihood that the plasma may be extinguished, or the operation may become unstable.

In view of the above problem, according to the exemplary embodiment, the control unit 80 not only controls the positions of the first slug 61a and the second slug 61b to the matching position, but also controls, based on the plasma state, the matching track which is the moving path through which the first slug 61a and the second slug 61b reach the matching position. To elaborate, tables indicating a relationship between the positions of the first slug 61a and the second slug 61b and the plasma emission intensity under the various plasma conditions (gas type, gas flow rate, pressure, power, antenna type, and so forth) are stored in the storage unit 83 of the control unit 80, and these tables are used to control the matching track of the first and second slugs 61a and 61b. That is, the slug controller 81 sends control signals to the motors 73a and 73b based on the detection value of the detector 82 and the position information of the first slug 61a and the second slug 61b detected by the encoders 75a and 75b. Then, when performing the impedance matching by controlling the positions of the first slug 61a and the second slug 61b such that they are located at the matching position where the reflection coefficient is small, a table having the corresponding plasma condition is selected from the storage unit 83. Then, based on the relationship between the positions of the first and second slugs 61a and 61b and the plasma emission intensity recorded in the table, the slug controller 81 controls the matching track of the first and second slugs 61a and 61b such that a plasma state, where the plasma may be extinguished or the operation may become unstable, is not generated. In the example of FIG. 8, the matching track of the slugs from the ignition position (1) to the matching position (2) is set to a route B passing through an area where the plasma emission is stabilized.

As stated above, by controlling the matching track as well as the matching position of the first slug 61a and the second slug 61b where the impedance matching is performed, it is possible to effectively suppress a problem that the plasma may be extinguished or the operation may become unstable when performing the impedance matching through the first slug 61a and the second slug 61b. Furthermore, since the plasma can be effectively suppressed from being extinguished, the range of processes to which this technique is applicable can be increased.

Second Exemplary Embodiment

In a second exemplary embodiment, only the configuration of a tuner and an antenna unit are different from those in the first exemplary embodiment. Since the other configurations are the same as those described in the first exemplary embodiment, only the configuration of the tuner and the antenna unit will be described herein while redundant description is omitted.

(Tuner and Antenna Unit)

Figure 9:
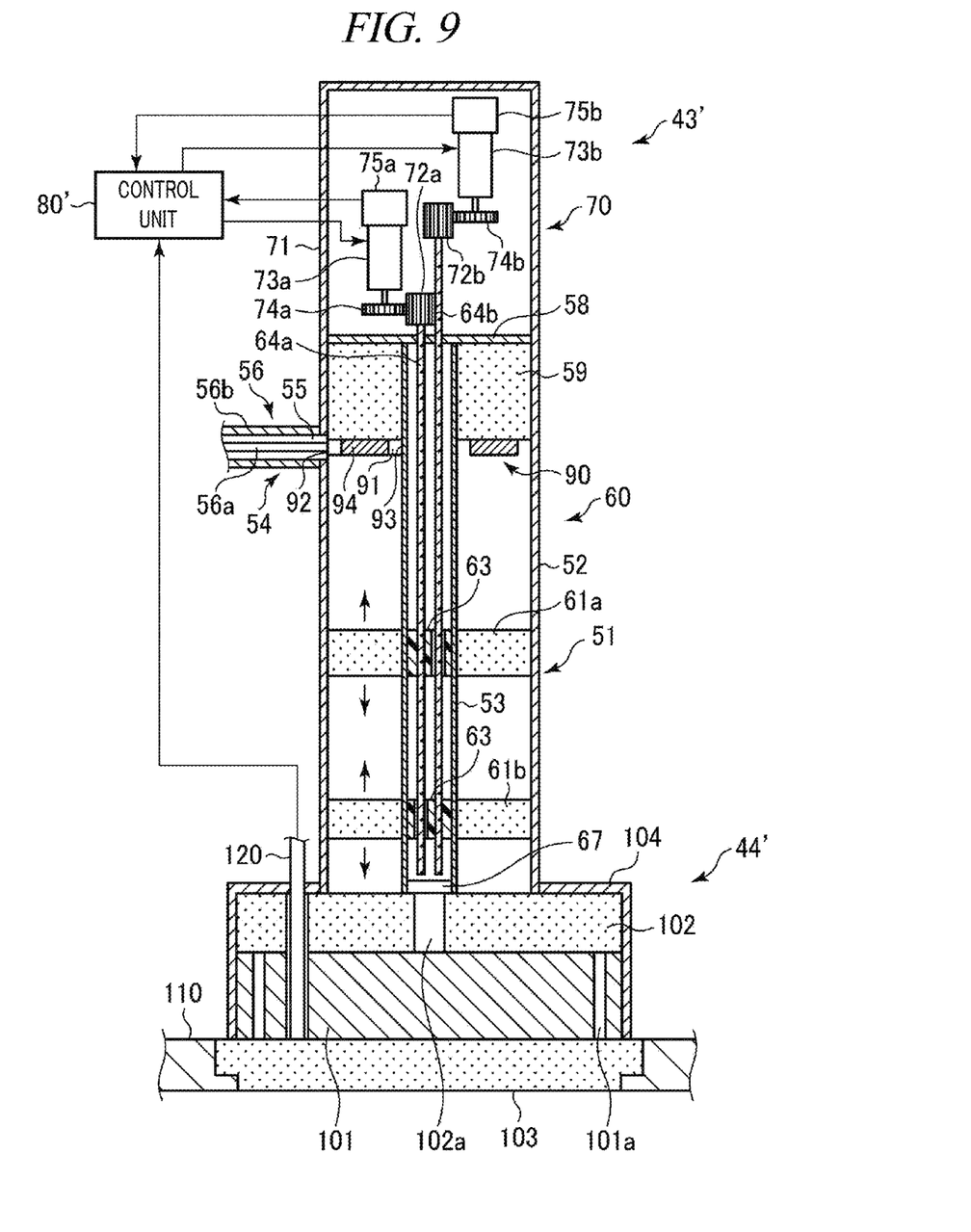
FIG. 9 is a cross sectional view illustrating a structure of a tuner and an antenna unit in a microwave plasma source according to a second exemplary embodiment.
Figure 10:
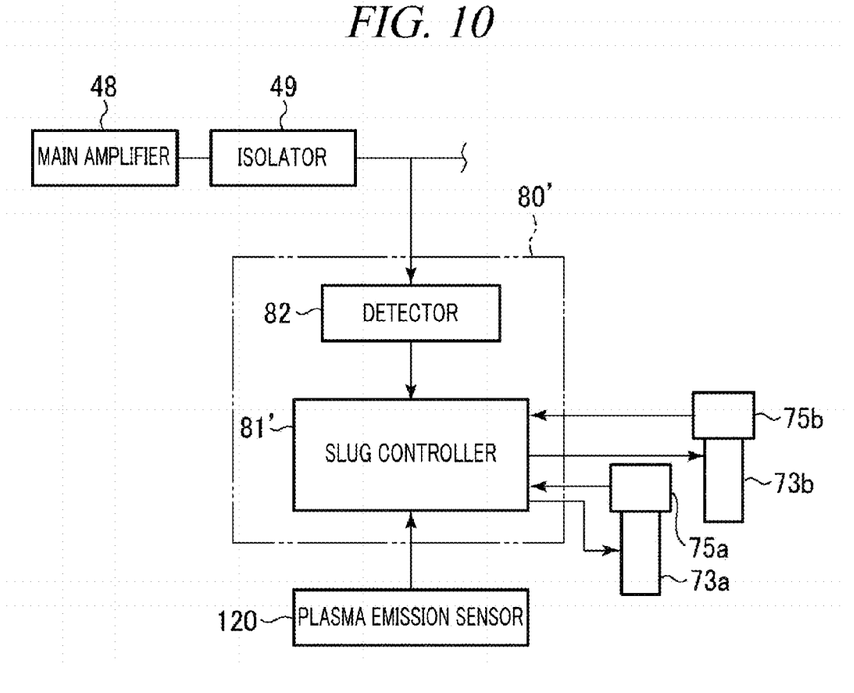
FIG. 10 is a block diagram illustrating a control unit of the tuner according to the second exemplary embodiment.

FIG. 9 is a cross sectional view illustrating the tuner and the antenna unit in a microwave plasma source according to the second exemplary embodiment. FIG. 10 is a block diagram illustrating a control unit of the tuner.

Basically, the tuner 43' in this second exemplary embodiment has the same configuration as that of the tuner 43 of the first exemplary embodiment except that the tuner 43' has a control unit 80' instead of the control unit 80 of the tuner 43 of the first exemplary embodiment. Further, the antenna unit 44' also has basically the same configuration as that of the antenna unit 44 of the first exemplary embodiment except that the antenna unit 44' additionally has a plasma emission sensor 120 configured to measure plasma emission intensity. Accordingly, in FIG. 9 and FIG. 10, parts identical to those described in the first exemplary embodiment will be assigned same reference numerals, and redundant description thereof will be omitted.

The plasma emission sensor 120 of the antenna unit 44' is extended from above the wavelength shortening member 102 to a top surface of the microwave transmitting plate 103 while penetrating the wavelength shortening member 102 and the planar slot antenna 101. The plasma emission sensor 120 is implemented by a light receiving device. The plasma emission sensor 120 is configured to detect emission of the plasma directly underneath the microwave transmission plate 103 therethrough.

Further, the control unit 80' of the tuner 43' includes, as depicted in FIG. 10, a slug controller 81'; and a detector 82. The detector 82 is configured the same as in the first exemplary embodiment, and configured to detect an impedance value at an input end or detect a progressive wave and a reflection wave via a directional coupler. The slug controller 81' sends control signals to motors 73a and 73b based on the detection value of the detector 82 and position information of the first slug 61a and the second slug 61b detected by the encoders 75a and 75b. Then, the slug controller 81' performs the impedance matching by controlling the positions of the first slug 61a and the second slug 61b such that the first slug 61a and the second slug 61b are located at the matching position where the reflection coefficient is small. In addition, based on the plasma state, specifically, based on the plasma emission intensity detected by the plasma emission sensor 120, the slug controller 81' controls the matching track which is a moving path through which the first slug 61a and the second slug 61b reach the matching position. Like the slug controller 81 of the first exemplary embodiment, the slug controller 81' also performs the impedance matching such that the impedance of the terminal end becomes, for example, 50Ω. If only one of the two slugs is moved, a track passing through an origin of the Smith chart is created. If the slugs are both moved, on the other hand, only a phase is rotated In this tuner 43', the microwave supplied from the power supply mechanism 54 is transmitted through the microwave transmission path 51 and reaches the antenna unit 44'. At this time, the impedance matching is automatically performed by the first slug 61a and the second slug 61b of the tuner 43', and, without substantial power reflection, the microwave is transmitted via the wavelength shortening member 102 of the antenna unit 44' from the tuner 43', and then, radiated from the slots 101a of the planar slot antenna 101. Then, the microwave is transmitted through the microwave transmitting plate 103 and propagated on the surface (bottom surface) of the microwave transmitting plate 103 which is in contact with plasma, so that the surface wave is generated. The powers of individual antenna units 44' are combined in a space within the chamber 1, so that the surface wave plasma is generated in the space within the chamber 1 and the wafer W as a processing target object is plasma-processed.

Even in the tuner 43' according to the second exemplary embodiment, when performing the impedance matching, the control unit 80' not only controls the positions of the first slug 61a and the second slug 61b to reach the matching position, but also controls, based on the plasma state, the matching track which is a moving path through which the first slug 61a and the second slug 61b reach the matching position. To elaborate, with the plasma emission intensity detected by the plasma emission sensor 120, the matching track of the first slug 61a and the second slug 61b is controlled. That is, the slug controller 81' sends control signals to the motors 73a and 73b based on the detection value of the detector 82 and the position information of the first slug 61a and the second slug 61b detected by the encoders 75a and 75b. Then, when performing the impedance matching by controlling the positions of the first slug 61a and the second slug 61b such that they are located at the matching position where the reflection coefficient is small, based on the plasma emission intensity detected by the plasma emission sensor 120, the slug controller 81' controls the matching track of the first and second slugs 61*a* and 61*b* such that a plasma state, where the plasma may be extinguished or the operation may become unstable, is not generated. Though the control algorithm is not limited, by way of example, the algorithm, in which the plasma emission intensity is detected all the time by the plasma emission sensor 120 and the first and second slugs 61*a* and 61*b* are moved based on the detected plasma emission intensity such that the plasma emission intensity is not decreased, may be adopted.

As stated above, by controlling the matching track as well as the matching position of the first slug 61*a* and the second slug 61*b* where the impedance matching is performed, it is possible to effectively suppress a problem that the plasma may be extinguished or the operation may become unstable when performing the impedance matching through the first slug 61*a* and the second slug 61*b*. Furthermore, since the plasma can be effectively suppressed from being extinguished, the range of processes to which this technique is applicable can be increased.

<Other Applications>

The above-described exemplary embodiments are not intended to be limiting and can be changed and modified in various ways within the scope of the present disclosure.

By way of example, the driving mechanism for the slugs is not limited to the example described in the above exemplary embodiments, and any driving mechanism may be employed. Furthermore, though the two slugs are provided in the above-described exemplary embodiment, the number of the slugs may be three or more. Furthermore, the circuit configurations of the microwave output unit 30, the microwave supply unit 40, the main amplifier 48, and so forth are not also limited to those described in the above exemplary embodiments. Specifically, when controlling directivity of the microwave radiated from the planar slot antenna or when the circularly polarized wave is not necessary, the phase shifter may be omitted.

In addition, the microwave supply unit 40 may not necessarily have the plural antenna modules, but may have only a single antenna module. Moreover, though the shape of the slots of the planar slot antenna is not clearly mentioned in the above-described exemplary embodiment, various slot patterns may be used depending on conditions involved.

Furthermore, though the plasma etching apparatus is described as the example of the plasma processing apparatus to which the microwave plasma source is applied, the microwave plasma source of the exemplary embodiments may also be applicable to various other plasma processes such as a film forming process, an oxynitriding process, an ashing process, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. A tuner, to which a microwave is supplied from a microwave power source, of transmitting the microwave to a planar antenna which radiates the microwave and matching an impedance of a plasma load with a characteristic impedance of the microwave power source in a plasma processing apparatus in which a plasma process is performed by generating plasma within a chamber with the microwave, the tuner comprising:

a microwave transmission path, having a coaxial structure, configured to transmit the supplied microwave to the planar antenna;

at least two slugs made of a dielectric material and configured to be moved along the microwave transmission path;

a driving unit configured to move the at least two slugs along the microwave transmission path; and a control unit configured to perform impedance matching by controlling positions of the at least two slugs such that the at least two slugs are located at a matching position where a reflection coefficient is small, and configured to control, based on a state of the plasma, a matching track through which the at least two slugs reach the matching position.

2. The tuner of claim 1, wherein the control unit is further configured to control the matching track of the at least two slugs such that a plasma state, where the plasma is extinguished or an operation becomes unstable, is not generated in the matching track.

3. The tuner of claim 1, wherein the control unit comprises a storage unit having stored therein a relationship between the positions of the at least two slugs and plasma emission intensity under each of various plasma conditions, and the control unit is further configured to control the matching track of the at least two slugs based on the relationship stored in the storage unit.

4. The tuner of claim 1, wherein the control unit is further configured to control the matching track of the at least two slugs based on a detection value of a plasma emission sensor configured to detect plasma emission intensity within the chamber.

5. A microwave plasma source in a plasma processing apparatus in which a plasma process is performed by generating microwave plasma within a chamber, the microwave plasma source comprising:

a microwave output unit, having a microwave power source, configured to output a microwave; and a microwave supply unit configured to transmit the microwave outputted from the microwave output unit and radiate the microwave into the chamber, wherein the microwave supply unit comprises:

a tuner as claimed in claim 1; and an antenna unit having a planar antenna configured to radiate the microwave transmitted from the tuner toward the chamber.

6. The microwave plasma source of claim 5, wherein the microwave output unit further comprises a splitter configured to split the microwave into multiple microwaves, the microwave supply unit further comprises a plurality of antenna modules configured to guide the multiple microwaves into the chamber, and each antenna module comprises the tuner and the antenna unit.

7. An impedance matching method performed in a tuner, to which a microwave is supplied from a microwave power source, of transmitting the microwave to a planar antenna which radiates the microwave and matching an impedance of a plasma load with a characteristic impedance of the microwave power source in a plasma processing apparatus in which a plasma process is performed by generating plasma within a chamber with the microwave, the impedance matching method comprises:

performing an impedance matching by controlling positions of at least two slugs made of a dielectric material and configured to be moved along a microwave transmission path having a coaxial structure, such that the at least two slugs are located at a matching position where a reflection coefficient is small; and controlling, based on a state of the plasma, a matching track as a moving path through which the at least two slugs reach the matching position.

8. The impedance matching method of claim 7, wherein the matching track of the at least two slugs is controlled such that a plasma state, where the plasma is extinguished or an operation becomes unstable, is not generated in the matching track.

9. The impedance matching method of claim 7, wherein a relationship between the positions of the at least two slugs and plasma emission intensity under each of various plasma conditions is stored, and the matching track of the at least two slugs is controlled based on the stored relationship.

10. The impedance matching method of claim 7, wherein the matching track of the at least two slugs is controlled based on a detection value of a plasma emission sensor configured to detect plasma emission intensity within the chamber.

\* \* \* \* \*

UNITED STATES PATENT AND TRADEMARK OFFICE
CERTIFICATE OF CORRECTION

PATENT NO. : 9,520,273 B2  
APPLICATION NO. : 15/073762  
DATED : December 13, 2016  
INVENTOR(S) : Yuki Osada et al.

Page 1 of 1

It is certified that error appears in the above-identified patent and that said Letters Patent is hereby corrected as shown below:

On the Title Page

Item (57) Abstract, Line 4, replace "(61b" with -- (61b) --.

Signed and Sealed this  
Twenty-eighth Day of February, 2017

Michelle K. Lee  
*Director of the United States Patent and Trademark Office*